United States Patent [19]
Fukuda et al.

[11] Patent Number: 5,307,323
[45] Date of Patent: Apr. 26, 1994

[54] DUAL-PORT MEMORY

[75] Inventors: Hiroyuki Fukuda; Toshiyuki Ogawa, both of Hyogo, Japan

[73] Assignee: Mitsubishi Denki Kabushiki Kaisha, Tokyo, Japan

[21] Appl. No.: 952,410

[22] Filed: Sep. 30, 1992

[30] Foreign Application Priority Data

Oct. 7, 1991 [JP] Japan .................................. 3-259273

[51] Int. Cl.$^5$ ................................................ G11C 7/00
[52] U.S. Cl. .......................... 365/230.05; 365/230.02; 365/221; 365/230.09; 365/189.02
[58] Field of Search ....................... 365/230.05, 230.02, 365/221, 230.09, 189.02

[56] References Cited

U.S. PATENT DOCUMENTS

| | | | |
|---|---|---|---|
| 4,347,587 | 8/1982 | Rao | 365/221 |
| 4,498,155 | 2/1985 | Mohan Rao | 365/221 |
| 4,930,108 | 5/1990 | Sugiyama | 365/230.02 |
| 5,065,369 | 11/1991 | Toda | 365/230.05 |

Primary Examiner—Eugene R. LaRoche
Assistant Examiner—Andrew Tran
Attorney, Agent, or Firm—Lowe, Price, LeBlanc & Becker

[57] ABSTRACT

A dual-port memory requiring fewer serial input/output pins. A multiplex/distribution circuit multiplexes data for n rows read from a memory cell array into m (m<n) pieces of serial data and outputs the same to the serial I/O port, and distributes m multiplexed serial signals input from the serial I/O port into n serial signals.

3 Claims, 9 Drawing Sheets

DUAL-PORT MEMORY

BACKGROUND OF THE INVENTION

1. Field of the Invention

The present invention relates generally to dual-port memories, and more specifically, to a dual-port memory including a random access memory connected to a first input/output port and a serial access memory connected to a second input/output port.

2. Description of the Background Art

Figure 6:
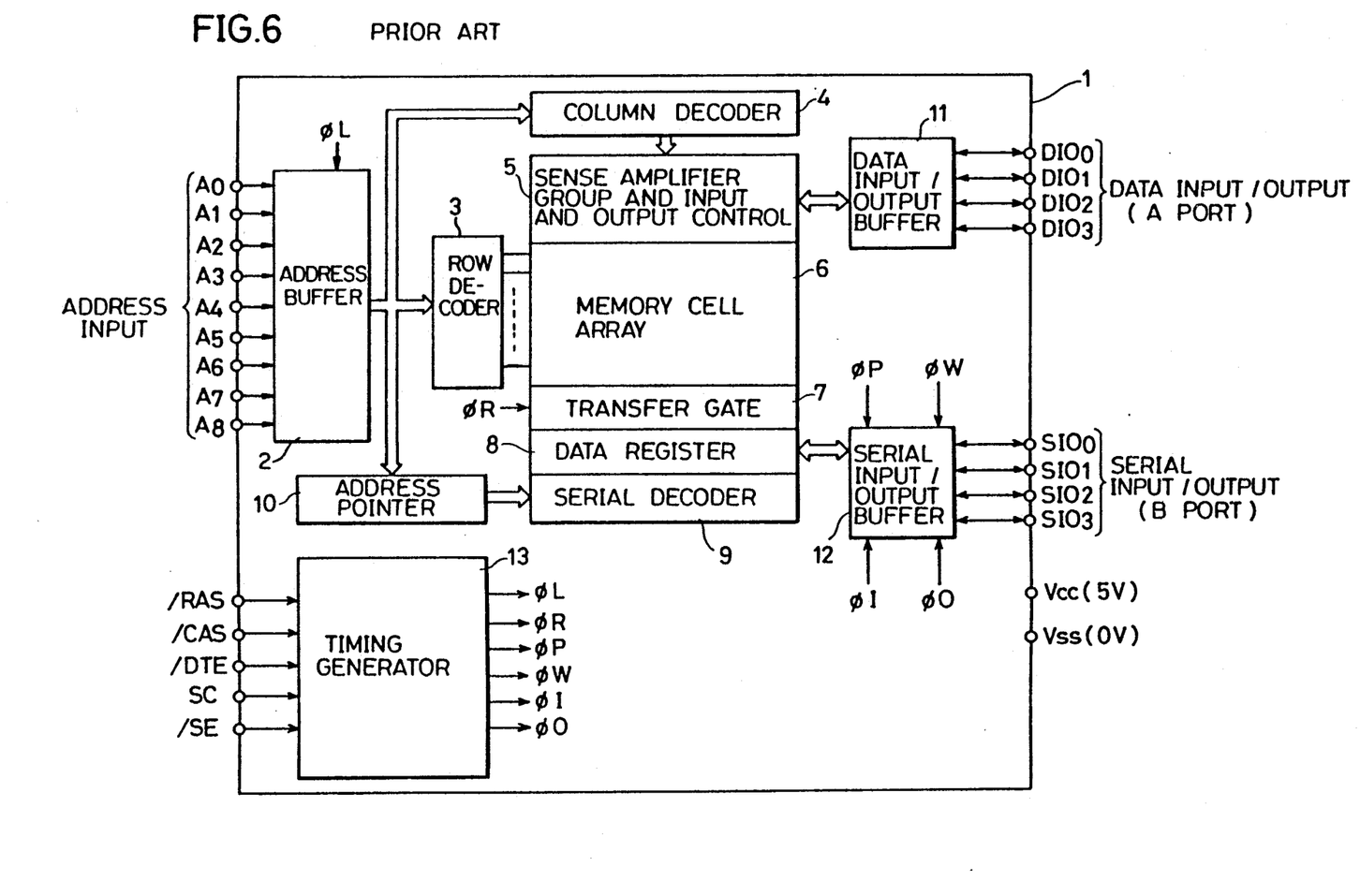
FIG. 6 is a block diagram showing a structure of a conventional dual-port memory.

FIG. 6 is a block diagram showing a structure of a conventional dual-port memory. In FIG. 6, provided on a semiconductor chip 1 are an address buffer 2, a row decoder 3, a column decoder 4, a sense amplifier group and input/output control circuit 5, a memory cell array 6, a transfer gate 7, a data register 8, a serial decoder 9, an address pointer 10, a data input/output buffer 11, a serial input/output buffer 12, and a timing generator 13. Timing generator 13 outputs various timing signals such as $\phi L$, $\phi R$, $\phi P$, $\phi W$, $\phi I$ and $\phi O$ based on externally applied various control signals such as a row address strobe signal $\overline{RAS}$, a column address strobe signal $\overline{CAS}$, a data transfer enable signal $\overline{DTE}$, a shift control signal SC and a shift enable signal $\overline{SE}$.

Address buffer 2 is provided with, for example, 9-bit address data A0-A8. Address buffer 2 latches row address data and column address data input in a time sharing manner in response to the timing signal $\phi L$ applied from timing generator 13. The row address data latched by address buffer 2 is applied to row decoder 3. The column address data latched by address buffer 2 is applied to column decoder 4. The column address data latched by address buffer 2 is also applied to address pointer 10.

Memory cell array 6 includes a plurality of word lines, a plurality of bit lines disposed crossing these word lines, and a plurality of memory cells arranged at the cross over points of the word lines and bit lines. Row decoder 3 selects one word line from the plurality of word lines in memory cell array 6, based on the row address data applied from address buffer 2. Sense amplifier group and input/output control circuit 5 includes a sense amplifier and an input/output control gate provided for every bit line in memory cell array 6. Column decoder 4 controls opening/closing of each input/output control gate based on the column address data applied from address buffer 20. Selection of a bit line is thus conducted. The input/output control gates in sense amplifier group and input/output control circuit 5 are connected to the first input/output port (hereinafter referred to as A port) through data input/output buffer 11.

The above-described address buffer 2, row decoder 3, column decoder 4, sense amplifier group and input/output control circuit 5, memory cell array 6 and data input/output buffer 11 constitute a random access memory (hereinafter referred to as RAM) to and from which writing and reading of data can be performed randomly.

Data register 8 includes a plurality of latch circuits arranged for the respective bit lines in memory cell array 6. The latch circuits connected in series constitute a so-called shift register. Transfer gate 7 controls data transmission between memory cell array 6 and data register 8 in response to the timing signal $\phi R$ applied from timing generator 3. Serial decoder 9 controls the shifting operation of data register 8 in response to pointer data applied from address pointer 10. Data register 8 is connected to the second input/output port (hereinafter referred to as B port) through serial input/output buffer 12. Serial input/output buffer 12 controls input/output of data between data register 8 and B port in response to the timing signals $\phi P$, $\phi W$, $\phi I$ and $\phi O$ applied from timing generator 13.

The above-described transfer gate 7, data register 8, serial decoder 9, address pointer 10 and serial input/output buffer 12 constitute a so-called serial access memory (hereinafter referred to as SAM). The SAM converts data of n rows read out en bloc from memory cell array 6 (data of 4 rows in the case of the dual-port memory shown in FIG. 6) into serial data, and outputs this serial data to B port. The SAM also converts externally input four pieces of serial data into parallel data of n rows and applies the same to memory cell array 6.

The dual-port memory shown in FIG. 6 has a structure of ×4 bits. In other words, A port and B port each have four data input/output pins. A port is capable of inputting/outputting data $DIO_0$–$DIO_3$ of 4 bits at a time. B port is capable of inputting/outputting four pieces of serial data $SIO_0$–$SIO_3$ at a time.

Figure 7:
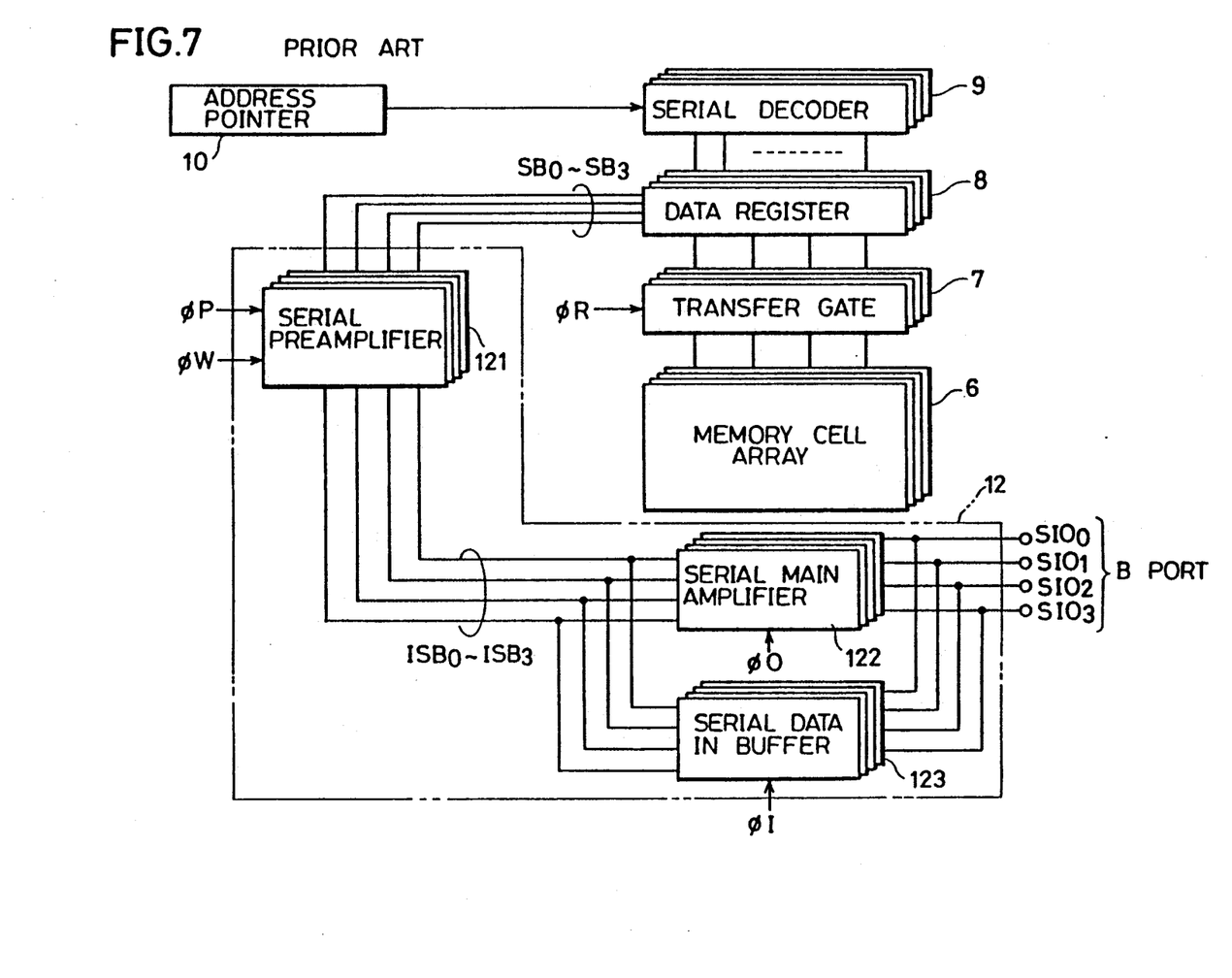
FIG. 7 is a block diagram showing in detail the structure of a part of the conventional dual-port memory shown in FIG. 6.

FIG. 7 is a block diagram partially showing the structure of the dual-port memory shown in FIG. 6, especially the structure of the SAM in detail. As shown in FIG. 7, memory cell array 6 has four array blocks or sectors. It is therefore possible to read and write data of 4 bits at a time from and to memory cell array 6. Transfer gate 7, data register 8 and serial decoder 9 each include four sets of circuits. Serial input/output buffer 12 includes a serial preamplifier 121, a serial main amplifier 122 and a serial data-in-buffer 123. These serial preamplifier 122 and serial data-in-buffer 123 each include four sets of circuits. Serial preamplifier 121 has its operation controlled in response to the timing signals $\phi P$ and $\phi W$ applied from timing generator 13. Serial main amplifier 122 has its operation controlled in response to the timing signal $\phi O$ applied from timing generator 13. Serial data-in-buffer 123 has its operation controlled in response to the timing signal $\phi I$ applied from timing generator 13.

Figure 8:
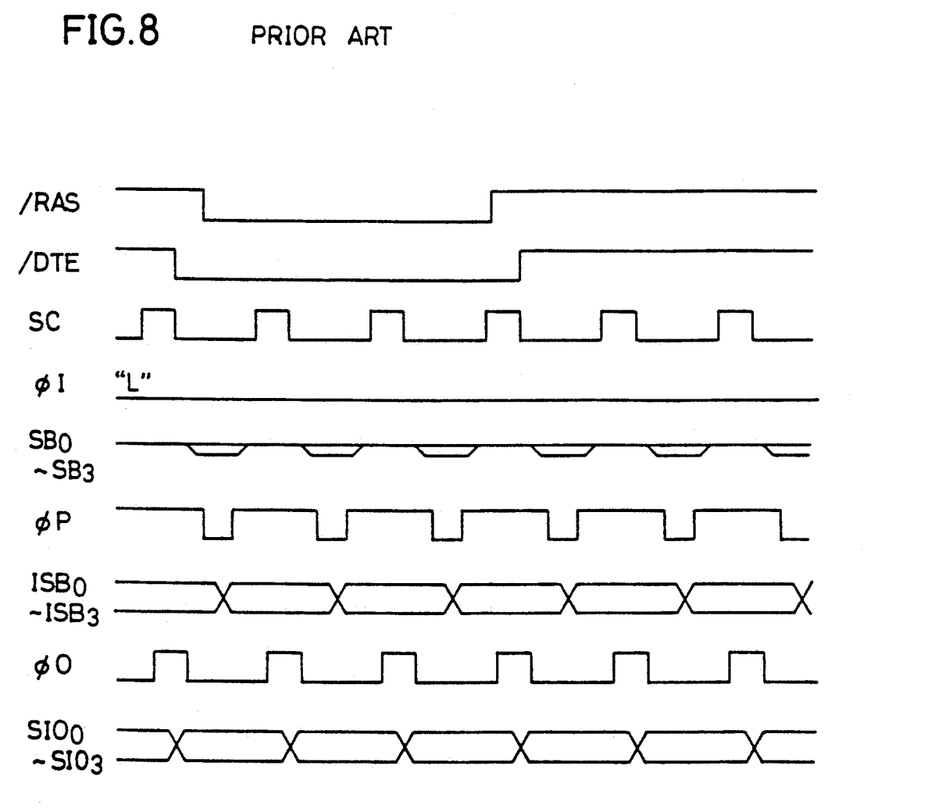
FIG. 8 is a timing chart illustrating the operation of a conventional dual-port memory at the time of its serial read transfer.
Figure 9:
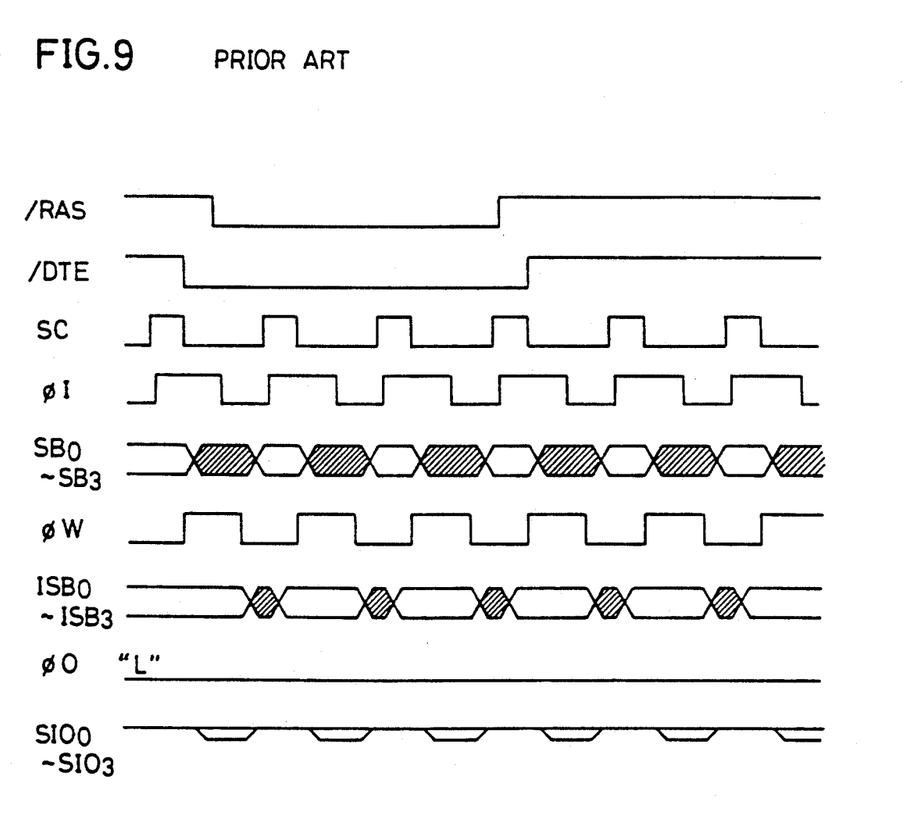
FIG. 9 is a timing chart illustrating the operation of a conventional dual-port memory at the time of its serial write transfer.

FIG. 8 is a timing chart showing the operation of the dual-port memory shown in FIGS. 6 and 7 at the time of serial read transfer. FIG. 9 is a timing chart showing the operation of the dual-port memory shown in FIGS. 6 and 7 at the time of serial write transfer. The term "serial read transfer" means a mode in which the SAM converts data of four rows read out from the memory cell array 6 of the RAM into serial data and outputs the same. "Serial write transfer" is a mode in which the SAM converts externally input four pieces of serial data into parallel data of four rows and transfers the same to memory cell array 6.

Referring to FIG. 8, the operation at the time of serial read transfer will be described. The row address strobe signal $\overline{RAS}$ is pulled to L level. In response to this, the timing signal $\phi L$ applied from timing generator 13 to address buffer 2 is activated, and address buffer 2 latches row address data. The row address data latched by address buffer 2 is applied to row decoder 3. Row decoder 3 decodes the applied row address data and selects a row corresponding to each array block in memory cell array 6. Memory cell array 6 as described above has four array blocks, and, therefore, four word lines are selected at a time for memory cell array 6 as a whole. Data stored in memory cells belonging to the selected word lines is read out to bit lines in memory cell array 6. Then, with the data transfer enable signal $\overline{DTE}$ being pulled to H level, the timing signal $\phi R$ is pulled to H level. Transfer gate 7 transfers the data of four rows read out from memory cell array 6 to data register 8 in response to the timing signal $\phi R$ being pulled to H level.

Data register 8 outputs serially the held data of four rows. Data register 8 has four circuits each capable of holding data of one row, and outputs from these circuits are applied to serial buses $SB_0$–$SB_3$, respectively.

Serial preamplifier 121 is activated in response to the timing signal $\phi P$ which is in synchronization with the serial control signal SC. At the time, serial preamplifier 121 is activated in synchronization with the shifting operation of data register 8 and amplifies serial signals serially output from data register 8. Four serial signals amplified by serial preamplifier 121 are applied to serial main amplifier 122 through internal serial buses $ISB_0$–$ISB_3$. Serial main amplifier 122 amplifies the four serial signals applied from serial preamplifier 121 in response to the timing signal $\phi O$ which is in synchronization with the serial control signal SC. The four serial signals amplified by serial main amplifier 122 are output to B port as serial data $SIO_0$–$SIO_3$.

Referring to FIG. 9, the operation of the conventional dual-port memory shown in FIGS. 6 and 7 at the time of its serial write transfer will be described. The row address strobe signal $\overline{RAS}$ is pulled to L level. In response to this, address buffer 2 latches the row address data. Row decoder 3 decodes the row address data latched in address buffer 2 and selects the word line of a corresponding row in each array block in memory cell array 6. Memory cells belonging to four word lines selected at that time allow writing of data transferred from the SAM.

B port is provided with the external four pieces of serial data $SIO_0$–$SIO_3$. Serial data-in-buffer 123 amplifies four serial signals input from B port in response to the timing signal $\phi I$ which is in synchronization with the serial control signal SC and outputs the amplified signals to internal serial buses $ISB_0$–$ISB_3$. At that time, the timing signal $\phi O$ is in the L level, and serial main amplifier 122 is deactivated. Serial preamplifier 121 operates in response to the timing signal $\phi W$ which is in synchronization with the serial control signal SC. At that time, the serial preamplifier 121 connects internal serial buses $ISB_0$–$ISB_3$ and serial buses $SB_0$–$SB_3$ if the timing signal $\phi W$ is in H level. However, serial preamplifier 121 outputs the input serial signals to serial buses $SB_0$–$SB_3$ without amplifying these signals. This is because the externally input serial data is written into memory cells after being amplified in sense amplifier group and input/output control circuit 5 at the time of data writing, and it is not particularly necessary to amplify the data at serial preamplifier 121. The four serial signals output from serial preamplifier 121 are applied to data register 8 through serial buses $SB_0$–$SB_3$.

Then, the data transfer enable signal $\overline{DTE}$ is pulled to H level, and the timing signal $\phi R$ is pulled to H level. This causes the data of four rows held in data register 8 to be transferred to memory cell array 6. At that time, memory cells of four rows are selected in each array block in memory cell array 6, and, therefore, the applied data is written into the memory cell array of these four rows.

A conventional dual-port memory structured as described above has a number of serial data input/output pins in each SAM, and requires a large circuit area for serial main amplifier 122 and serial data-in-buffer 123 in serial input/output buffer 120. For example, in a dual-port memory of ×4 bit structure shown in FIGS. 6 and 7 must be provided with four serial data input/output pins at B port. Serial main amplifier 122 and serial data-in-buffer 123 each require four sets of circuits for processing four serial signals.

SUMMARY OF THE INVENTION

It is therefore an object of the present invention to provide a dual-port memory which has a reduced number of serial data input/output pins in its SAM, and a reduced area for each internal circuitry.

A dual-port memory in accordance with the present invention includes a random access memory, a serial access memory, and a multiplex/distribution circuit. The random access memory is connected to a first input/output port and performs random writing and reading of data. The serial access memory is connected to a second input/output port, converts parallel data of n rows (n is an integer equal to 2 or more) simultaneously read out from the random access memory into n pieces of serial data and outputs the same, while converts applied n pieces of serial data into parallel data of n rows and applies the same to the random access memory. The multiplex/distribution circuit multiplexes n pieces of serial data output from the serial access memory into m pieces of serial data (m<n) and outputs the same to the second input/output port, and distributes multiplexed m pieces of serial data input from the second input/output port into n pieces of serial data and applies the same to the random access memory.

According to the invention, n pieces of serial data output from the serial access memory are multiplexed into m pieces of serial data and output to the second input/output port. Also, multiplexed m pieces of serial data input from the second input/output port are distributed into n pieces of serial data and applied to the random access memory. Thus, the number of the serial data input/output pins in the second input/output port is reduced to m from n in a conventional dual-port memory. Also, the circuit area of the internal circuitry occupied in the serial access memory is reduced, thereby reducing the chip area.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
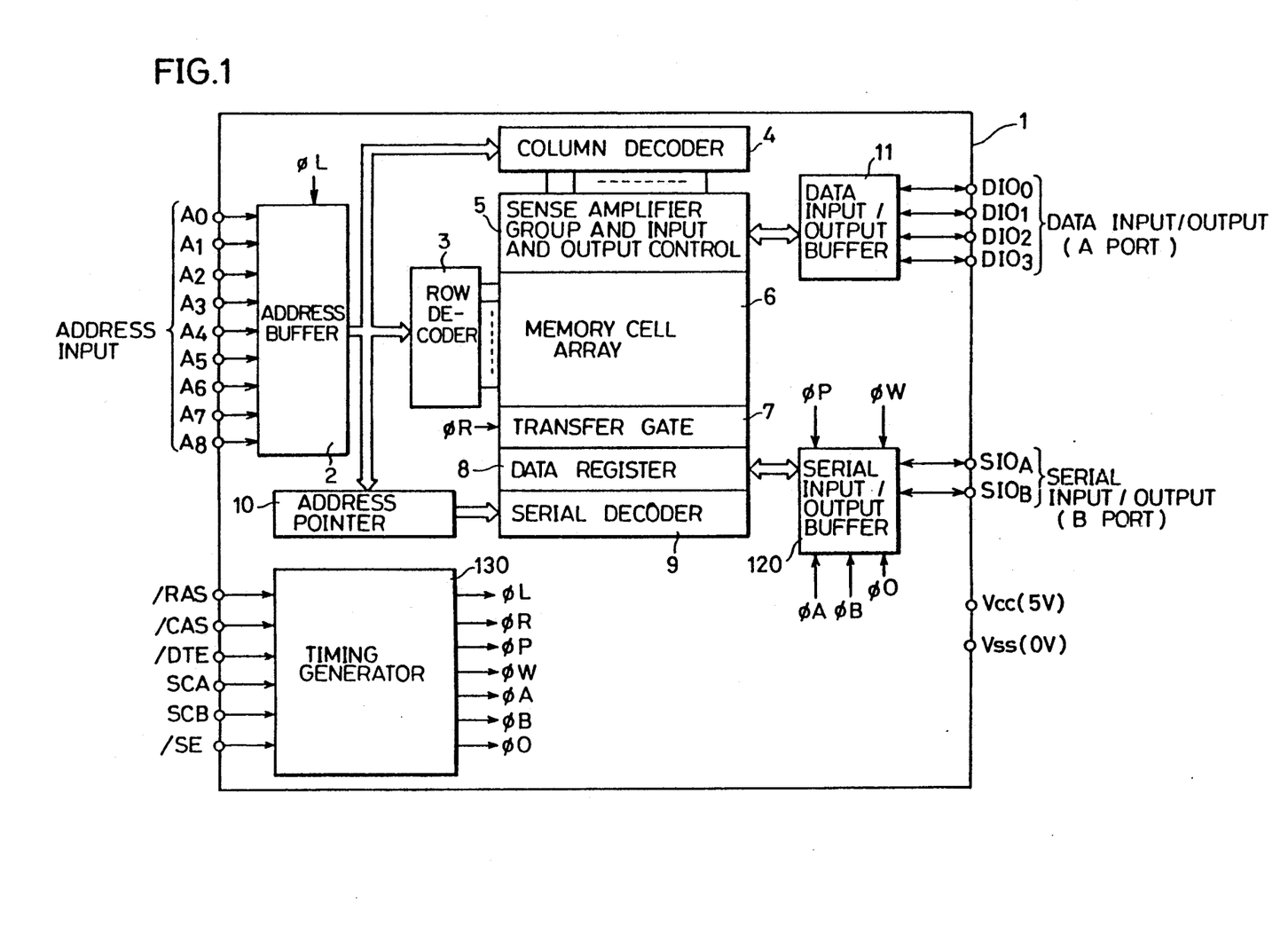
FIG. 1 is a block diagram showing a structure of a dual-port memory in accordance with the one embodiment of the present invention.

FIG. 1 is a block diagram showing a structure of a dual-port memory in accordance with one embodiment of the present invention. In FIG. 1, as similar to the conventional dual-port shown in FIG. 6, provided on semiconductor chip 1 are address buffer 2, row decoder 3, column decoder 4, sense amplifier group and input-/output control circuit 5, memory cell array 6, transfer gate 7, data register 8, serial decoder 9, address pointer 10, and data input/output buffer 11. Furthermore, a timing generator 130 is provided instead of timing generator 13 in FIG. 6, and a serial input/output buffer 120 is provided in place of serial input/output buffer 12 shown in FIG. 6.

Timing generator 130 is externally provided with a row address strobe signal $\overline{RAS}$, a column address strobe signal $\overline{CAS}$, a data transfer enable signal $\overline{DTE}$, and a serial enable signal $\overline{SE}$. Timing generator 130 is further provided with serial control signals SCA and SCB which are of non-overlapping type, instead of the serial control signal SC in FIG. 6. Timing generator 130 generates timing signals $\phi L$, $\phi R$, $\phi P$, $\phi W$, $\phi A$, $\phi B$ and $\phi O$ in response to these control signals externally applied.

Serial input/output buffer 120 has its operation controlled in response to the timing signals $\phi P$, $\phi W$, $\phi A$, $\phi B$ and $\phi O$ applied from timing generator 130.

B port connected to serial input/output buffer 120 includes two serial signal input/output pins. One serial signal input/output pin inputs/outputs a serial signal $SIO_A$. The other serial signal input/output pin inputs-/outputs a serial signal $SIO_B$.

Figure 2:
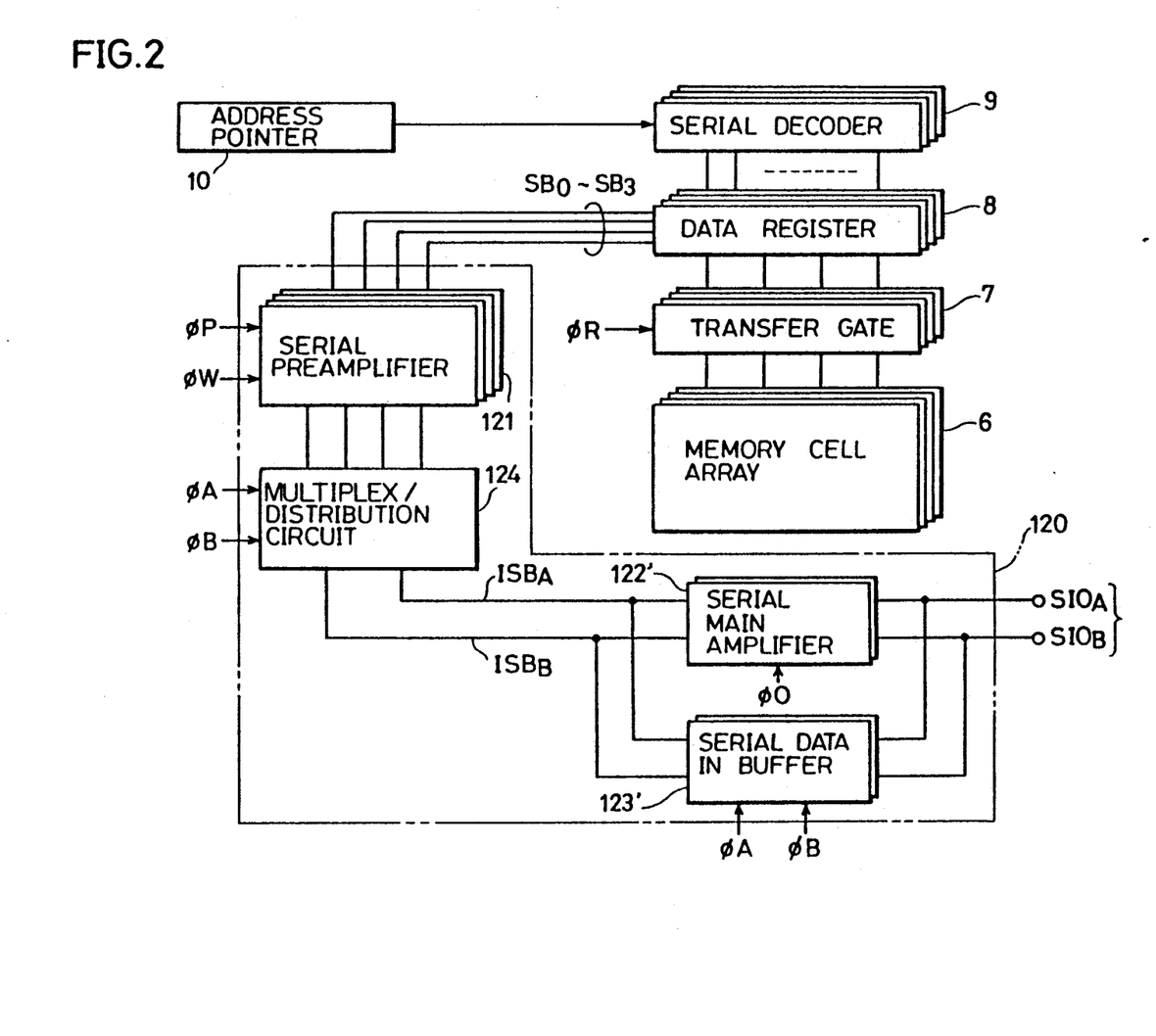
FIG. 2 is a block diagram showing in detail the structure of the characteristic part of the dual-port memory shown in FIG. 1.

FIG. 2 is a block diagram showing a part of the dual-port memory shown in FIG. 1, particularly the structure of SAM in detail. In FIG. 2, memory cell array 6, transfer gate 7, data register 8, serial decoder 9, and address pointer 10 have similar structures to those shown in FIG. 7. In serial input/output buffer 120, a serial main amplifier 122, and a serial data-in-buffer 123' each include two sets of circuits in correspondence to the two serial signal input/output pins in B port. A multiplex/distribution circuit 124 is provided between serial main amplifier 122' and serial data-in-buffer 123', and a serial preamplifier 121. Multiplex/distribution circuit 124 has its operation controlled in response to the timing signals $\phi A$ and $\phi B$ applied from timing generator 130. Multiplex/distribution circuits 124 multiplexes four serial signals applied from serial preamplifier 121 and outputs the same to two internal serial buses $ISB_A$ and $ISB_B$. Multiplex/distribution circuit 124 also distributes two sets of multiplied serial signals input from internal serial buses $ISA_A$ and $ISB_B$ multiplexed into four serial signals and outputs the same to serial preamplifier 121.

Figure 3:
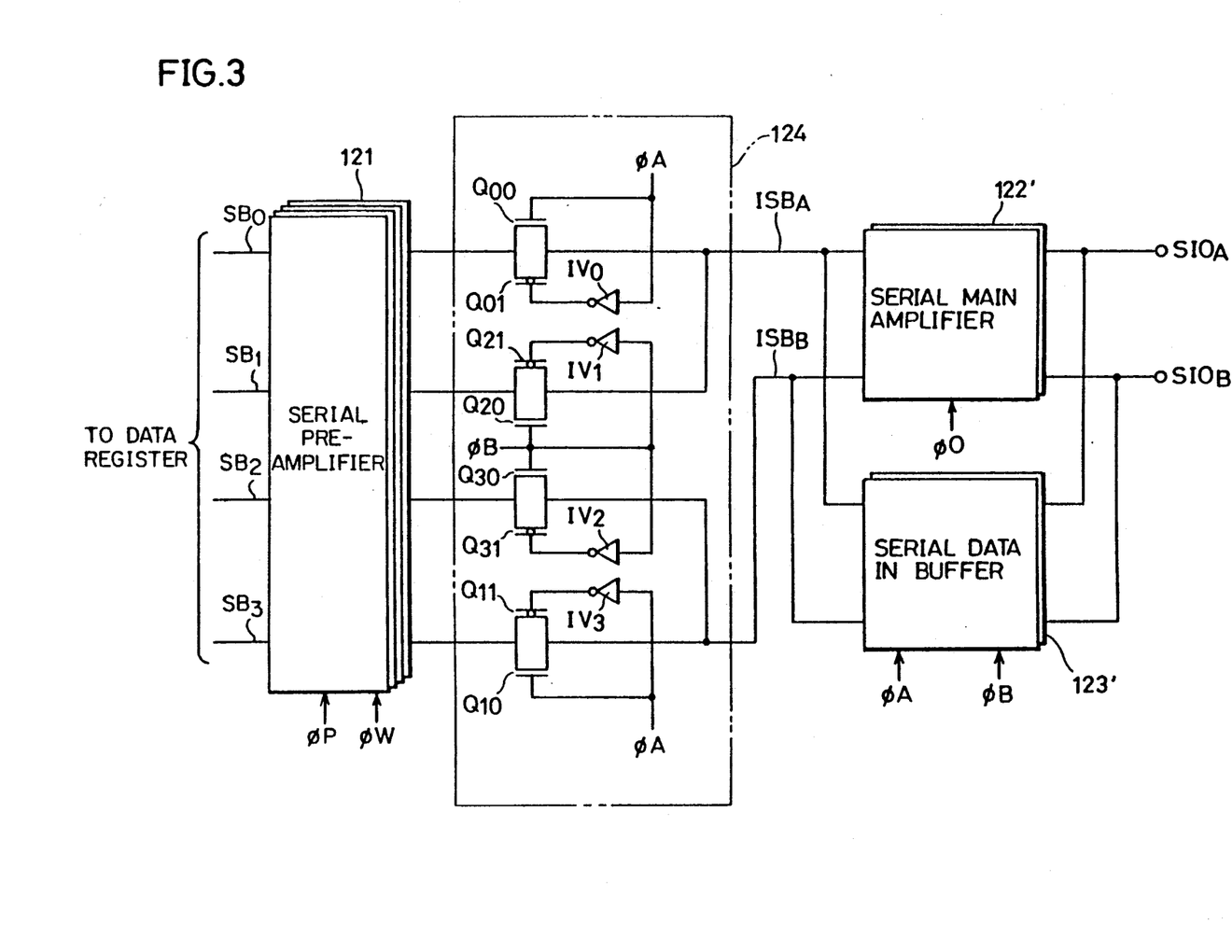
FIG. 3 is a circuit diagram showing in detail the structure of a serial input/output buffer 120 in FIG. 2.

FIG. 3 is a circuit diagram showing in detail the structure of serial input/output buffer 120 shown in FIG. 2. In FIG. 3, multiplex/distribution circuit 124 includes N channel MOS transistors $Q_{00}$, $Q_{20}$, $Q_{30}$, $Q_{10}$, P channel MOS transistors $Q_{01}$, $Q_{21}$, $Q_{31}$, $Q_{11}$, and inverters $IV_0$–$IV_3$. Transistors $Q_{00}$ and $Q_{01}$ are interposed in parallel between serial bus $SB_0$ and internal serial bus $ISB_A$. The gate of transistor $Q_{00}$ is supplied with the timing signal $\phi A$. The gate of transistor $Q_{01}$ is supplied with an output signal from inverter $IV_0$, in other words the inverted signal of the timing signal $\phi A$. Transistors $Q_{21}$ and $Q_{20}$ are interposed in parallel between serial bus $SB_1$ and internal serial bus $ISB_A$. The gate of transistor $Q_{20}$ is supplied with the timing signal $\phi B$. The gate of transistor $Q_{21}$ is supplied with an output signal from inverter $IV_1$, in other words the inverted signal of the timing signal $\phi B$. Transistors $Q_{30}$ and $Q_{31}$ are interposed in parallel between serial bus $SB_2$ and internal serial bus $ISB_B$. The gate of transistor $Q_{30}$ is supplied with the timing signal $\phi B$. The gate of transistor $Q_{31}$ is supplied with an output signal from inverter $IV_2$, in other words the inverted signal of the timing signal $\phi B$. Transistors $Q_{11}$ and $Q_{10}$ are interposed in parallel between serial bus $SB_3$ and internal serial bus $ISB_B$. The gate of transistor $Q_{10}$ is supplied with the timing signal $\phi A$. The gate of transistor $Q_{11}$ is supplied with an output signal from inverter $IV_3$, in other words the inverted signal of the timing signal $\phi A$.

Internal serial bus $ISB_A$ is connected to serial main amplifier 122' and serial data-in-buffer 123'. Internal serial bus $ISB_B$ is connected to serial main amplifier 122' and serial data-in-buffer 123'. Serial main amplifier 122' is connected to two serial signal input/output pins in B port. Serial data-in-buffer 123' is connected to two serial signal input/output pins in B port. Serial main amplifier 122' and serial data-in-buffer 123' therefore each include two sets of circuits.

Figure 4:
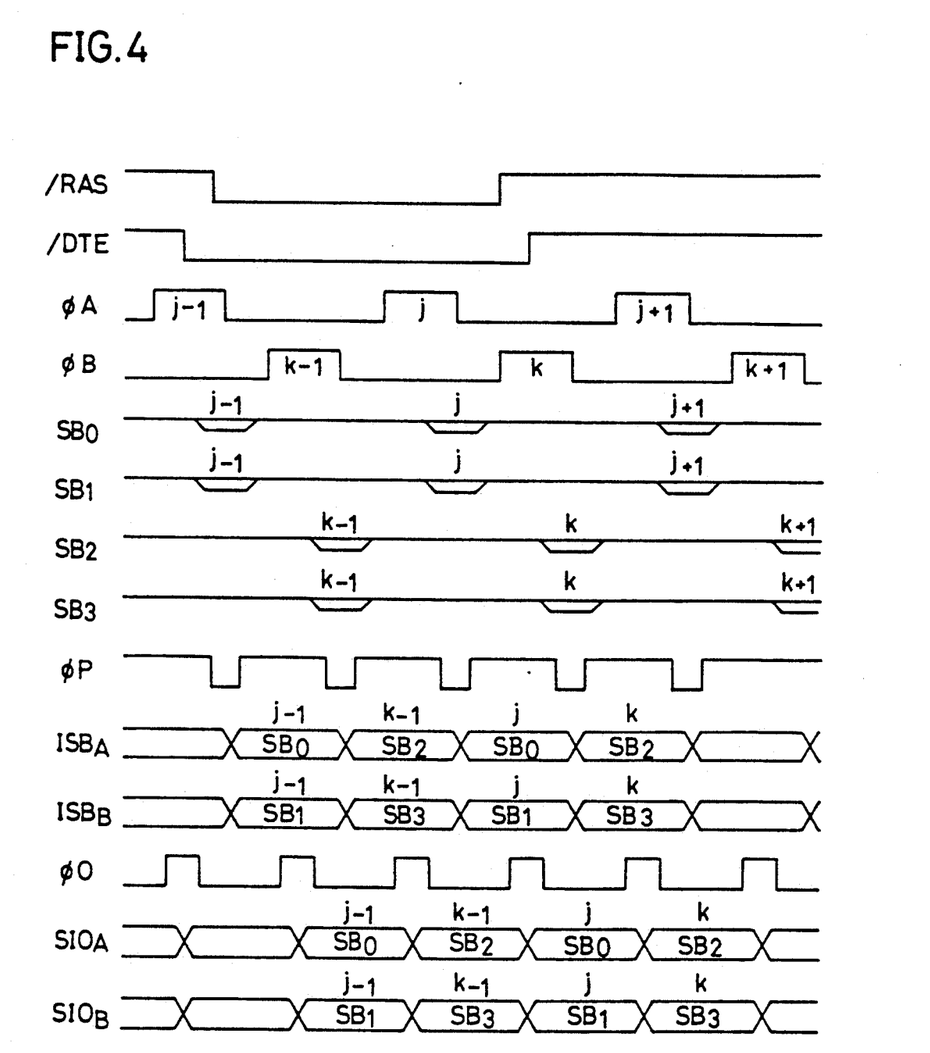
FIG. 4 is a timing chart illustrating the operation of the embodiment shown in FIGS. 1 to 3 at the time of its serial read transfer.
Figure 5:
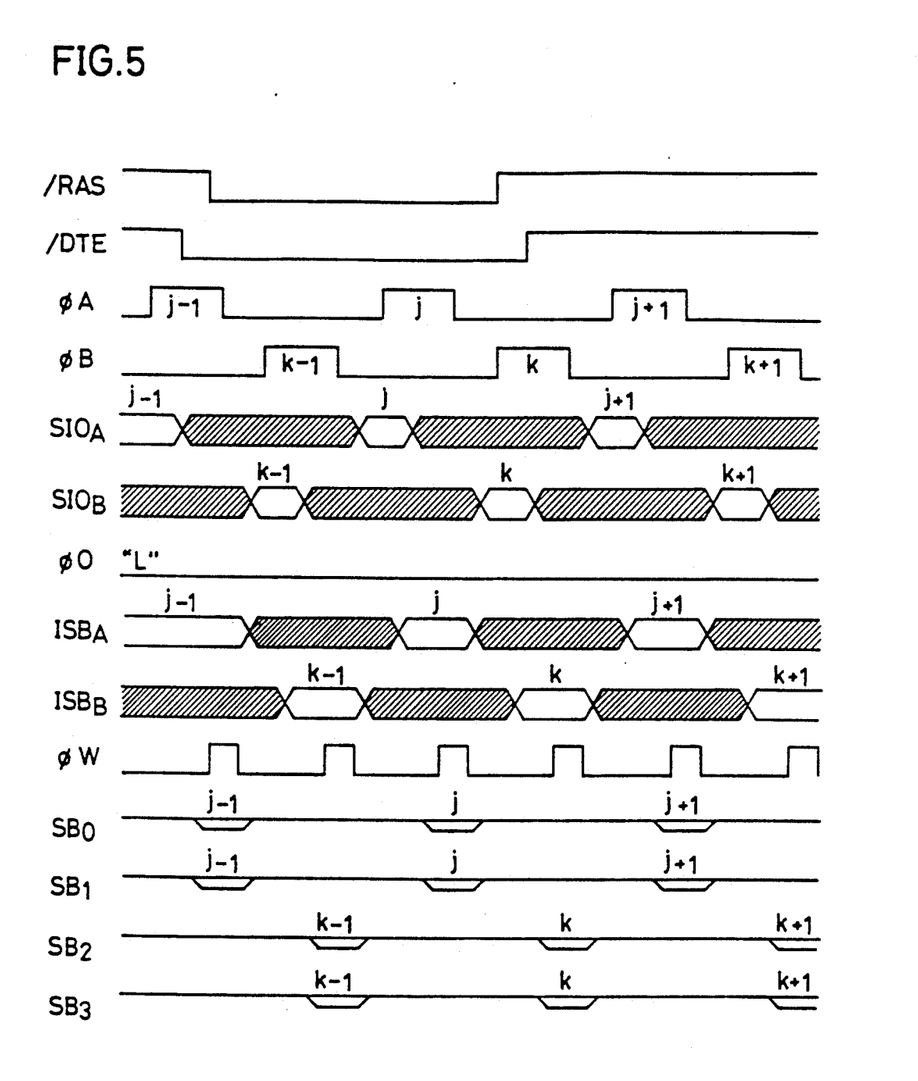
FIG. 5 is a timing chart illustrating the operation of the embodiment shown in FIGS. 1 to 3 at the time of its serial write transfer.

FIG. 4 is a timing chart illustrating the operation of the dual-port memory shown in FIGS. 1–3 at the time of the serial read transfer operation. FIG. 5 is a timing chart illustrating the operation of the dual-port memory shown in FIGS. 1–3 at the time of the serial write transfer operation. The operation of the dual-port memory of the present embodiment shown in FIGS. 1–3 will be described in conjunction with FIGS. 4 and 5.

Referring to FIG. 4, description will be provided on the operation of serial read transfer. With the row strobe signal $\overline{RAS}$ being pulled to L level, address buffer 2 latches row address data in response to the timing signal $\phi L$ from timing generator 130. Row decoder 3 decodes the row address data latched in address buffer 2, and selects the word lines of corresponding rows in four array blocks in memory cell array 6.

Then, when the data transfer enable signal $\overline{DTE}$ is pulled to H level, the timing signal $\phi R$ is pulled to H level. This causes data of memory cell array of four rows selected in the array blocks in memory cell array 6 to be transferred to data register 8.

Serial decoder 9 decodes pointer data applied from address pointer 10 and causes data register 8 to perform shifting operation. This permits read data of four rows to be output serially from data register 8 to serial buses $SB_0$–$SB_3$.

Serial preamplifier 121 amplifies four serial signals applied from data register 8 in response to the timing signal $\phi P$ and outputs the same.

Multiplex/distribution circuit 124 multiplexes four serial signals applied from serial preamplifier 121 into two serial signals in response to the timing signals $\phi A$ and $\phi B$, and outputs the same to internal serial buses $ISB_A$ and $ISB_B$. More specifically, the timing signals $\phi A$ and $\phi B$ are signals in synchronization with shift control signals SCA and CSB and two phase clock signals of non-overlapping type as shown in FIG. 4. When the timing signal $\phi A$ is in H level, transistors $Q_{00}$, $Q_{01}$, $Q_{11}$, $Q_{10}$ in FIG. 3 are turned on, and transistors $Q_{21}$, $Q_{20}$, $Q_{30}$, $Q_{31}$ are turned off. The signal of serial bus $SB_0$ is transmitted to internal serial bus $ISB_A$, and the signal of serial bus $SB_3$ is transmitted to internal serial bus $ISB_B$. When the timing signal $\phi B$ is in H level, transistors $Q_{21}$, $Q_{20}$, $Q_{30}$, $Q_{31}$ are turned on, and transistors $Q_{00}$, $Q_{01}$, $Q_{11}$, $Q_{10}$ are turned off. The signal of serial bus $SB_1$ is transmitted to internal serial bus $ISB_A$, and the signal of serial bus $SB_3$ is transmitted to internal serial bus $ISB_3$. As described above, the serial signals of serial buses $SB_0$ and $SB_1$ are multiplexed and output to internal serial bus $ISB_A$, and the serial signals of serial buses $SB_2$ and $SB_3$ are multiplexed and output to internal serial bus $ISB_B$. Serial main amplifier 122' amplifies two sets of serial signals multiplexed and input from internal serial buses $ISB_A$ and $ISB_B$ in response to the timing signal $\phi 0$ and outputs the amplified signals to B port. Serial signals $SIO_A$ and $SIO_B$ as shown in FIG. 4 are provided from B port accordingly.

Referring to FIG. 5, the operation at the time of serial write transfer operation will be described. The row address strobe signal $\overline{RAS}$ is pulled to L level. In response to this, address buffer 2 latches row address data, and row decoder 3 selects word lines of corresponding four rows in array blocks in memory cell array 6. Memory cells of the four rows in memory cell array 6 therefore permits writing of data.

Then, the multiplexed two sets of serial signals are externally input to B port. The serial signal $SIO_A$ input at that time is of multiplexed write data for two rows. Similarly, the serial signal $SIO_B$ input at that time is of multiplexed write data for two rows.

Serial data-in-buffer 123' amplifies the serial signals $SIO_A$ and $SIO_B$ input at that time in response to the timing signals $\phi A$ and $\phi B$ and outputs the amplified signals to internal serial buses $ISB_A$ and $ISB_B$. At that time, the timing signal $\phi O$ is in L level and serial main amplifier 122' is deactivated as a result.

Multiplex/distribution circuit 124 distributes the two sets of serial signals applied from internal serial buses $ISB_A$ and $ISB_B$ into four serial signals and outputs these signals. In other words, when the timing signal $\phi A$ is in H level, transistors $Q_{00}$, $Q_{01}$, $Q_{11}$, $Q_{10}$ are turned on, the serial signal of internal serial bus $ISB_A$ is transmitted to serial bus $SB_0$ and the serial signal of the internal serial bus $ISB_B$ is transmitted to serial bus $SB_3$. In contrast, when the timing signal $\phi B$ is in H level, transistors $Q_{21}$, $Q_{20}$, $Q_{30}$, $Q_{31}$ are turned on, the serial signal of internal serial bus $ISB_A$ is transmitted to serial bus $SB_1$, and the serial signal of internal serial bus $ISB_B$ is transmitted to serial bus $SB_2$. In other words, the multiplied serial signals in internal serial bus $ISB_A$ are distributed to two serial buses $SB_0$ and $SB_1$, the multiplexed serial signals in internal serial bus $ISB_B$ are distributed to the two serial buses $SB_2$ and $SB_3$.

Serial preamplifier 121 attains a data through state in response to the timing signal $\phi W$ and outputs the distributed four serial signals to data register 8.

Then, the timing signal $\phi R$ is pulled to H level in response to the rising of the data transfer enable signal $\overline{DTE}$ to H level, and transfer gate 7 transfers write data for four rows held in data register 8 to memory cell array 6. Thus, data is written into each memory cell of a row selected in each array block in memory cell array 6.

Although the dual-port memory of the present embodiment shown in FIGS. 1–3 is of $\times 4$ bit structure, the number of serial signal input/output pins provided on B port side is just two. Also, serial main amplifiers 122' and serial data-in-buffer 123' are provided with just two sets of circuits. Therefore, as compared to the conventional dual-port memory shown in FIGS. 6 and 7, the number of serial signal input/output pins required is reduced, and the circuit area required for the internal circuitry can be reduced.

Although in the above-described embodiments, the case of a dual-port memory of $\times 4$ bit structure has been described, the present invention is applicable to dual-port memories of any type having a plural bit structure.

Also in the above-described embodiment, multiplex/distribution circuit 124 is controlled by the timing signals $\phi A$ and $\phi B$, but its operation may be controlled by a larger number of timing signals of non-overlapping type. In this case, the number of rows of a serial signal multiplexed in a time sharing manner output to one internal serial bus is further increased, and the transmission rate of data is therefore reduced, but the number of serial input/output signal pins and the circuit area occupied by the internal circuitry can be further reduced.

Also in the above-described embodiment, the timing signals $\phi A$ and $\phi B$ are generated in response to the shift control signals SCA, and SCB externally applied, but the timing signals $\phi A$ and $\phi B$ may be generated in response to the column address strobe signal $\overline{CAS}$.

As described above, according to the present invention, the number of serial signal input/output pins required can be reduced and a dual-port memory with reduced area required for its internal circuitry and its chip can be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dual-port memory comprising:
 a random access memory connected to a first input/output port for random writing and reading of data;
 a serial access memory connected to a second input/output port for converting parallel data for n (n is an integer equal to 2 or more) rows simultaneously read out from said random access memory into n pieces of serial data, outputting the same, converting applied n pieces of serial data into parallel data for n rows and applying the same to said random access memory, said second input/output port having m (m<n) serial signal input/output pins;
 multiplex/distribution means for multiplexing n pieces of serial data output from said serial access memory into m pieces of serial data, outputting the same to said second input/output port, distributing multiplexed m pieces of serial data input from said second input/output port into n pieces of serial data and applying the same to said random access memory;
 m amplification means for output for individually amplifying m pieces of serial data output from said multiplex/distribution means; and
 m amplification means for input for individually amplifying m pieces of serial data applied from said second input/output port to said multiplex/distribution means.

2. A dual-port memory as recited in claim 1, wherein said multiplex/distribution means performs multiplex and distribution of serial data in response to a plurality of timing signals having phases different from each other.

3. A dual-port memory as recited in claim 2 further comprising a timing generator for generating said plurality of timing signals having phases different from each other based on an externally input control signal.

* * * * *